United States Patent
Ho

(10) Patent No.: US 8,789,824 B2
(45) Date of Patent: Jul. 29, 2014

(54) TEST PLATFORM

(75) Inventor: Ten-Chen Ho, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 121 days.

(21) Appl. No.: 13/568,117

(22) Filed: Aug. 6, 2012

(65) Prior Publication Data
US 2014/0022712 A1      Jan. 23, 2014

(30) Foreign Application Priority Data
Jul. 17, 2012   (CN) .......................... 2012 1 0246646

(51) Int. Cl.
*B25B 1/00*    (2006.01)

(52) U.S. Cl.
USPC .............................. 269/60; 269/289 R; 269/55

(58) Field of Classification Search
USPC ................................ 269/60, 289 R, 302.1, 55
See application file for complete search history.

(56) References Cited

U.S. PATENT DOCUMENTS

| | | | |
|---|---|---|---|
| 5,906,539 A * | 5/1999 | Tabel ............................. | 451/403 |
| 6,637,737 B1 * | 10/2003 | Beecherl et al. ................ | 269/71 |
| 7,905,472 B2 * | 3/2011 | Nakano et al. ................... | 269/71 |
| 2008/0264755 A1 | 10/2008 | Kobs et al. | |
| 2010/0194015 A1 * | 8/2010 | Vekstein et al. ........... | 269/289 R |
| 2011/0128815 A1 | 6/2011 | Wei | |
| 2014/0022712 A1 * | 1/2014 | Ho ............................ | 361/679.01 |

FOREIGN PATENT DOCUMENTS

| CN | 101282894 A | 10/2008 |
|---|---|---|
| CN | 102079321 A | 6/2011 |

* cited by examiner

*Primary Examiner* — Lee D Wilson
(74) *Attorney, Agent, or Firm* — Novak Druce Connolly Bove + Quigg LLP

(57) ABSTRACT

A test platform includes a supporting member, an annular first slide rail below the supporting member, and an annular conductive second slide rail below the first slide rail. The second slide rail is electrically connected to a power source. An uninterrupted power supply (UPS) is mounted on a bottom of the supporting member. A power socket is mounted on the supporting member and electrically connected to the UPS. A number of first wheels are mounted on the bottom of the supporting member. Each first wheel rests on and can roll along the first slide rail. A number of conductive second wheels are mounted on a bottom of the UPS. Each second wheel rests on and can roll along the second slide rail.

7 Claims, 2 Drawing Sheets

TEST PLATFORM

BACKGROUND

1. Technical Field

The present disclosure relates to a test platform.

2. Description of Related Art

Electronic equipment undergoing electromagnetic interference (EMI) testing may be placed on a round stage. The stage includes a plurality of wheels capable of rolling along a rail so that the stage can be rotated 360 degrees. A power socket is mounted on the stage to supply power for the items. A cables of the power socket is connected to a power source. When the stage is rotated several laps, the cable of the power socket is easily tangled, even seriously damaged.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure, including the accompanying drawings, is illustrated by way of example and not by way of limitation. It should be noted that references to "an" or "one" embodiment in this disclosure are not necessarily to the same embodiment, and such references mean at least one.

Figure 1:
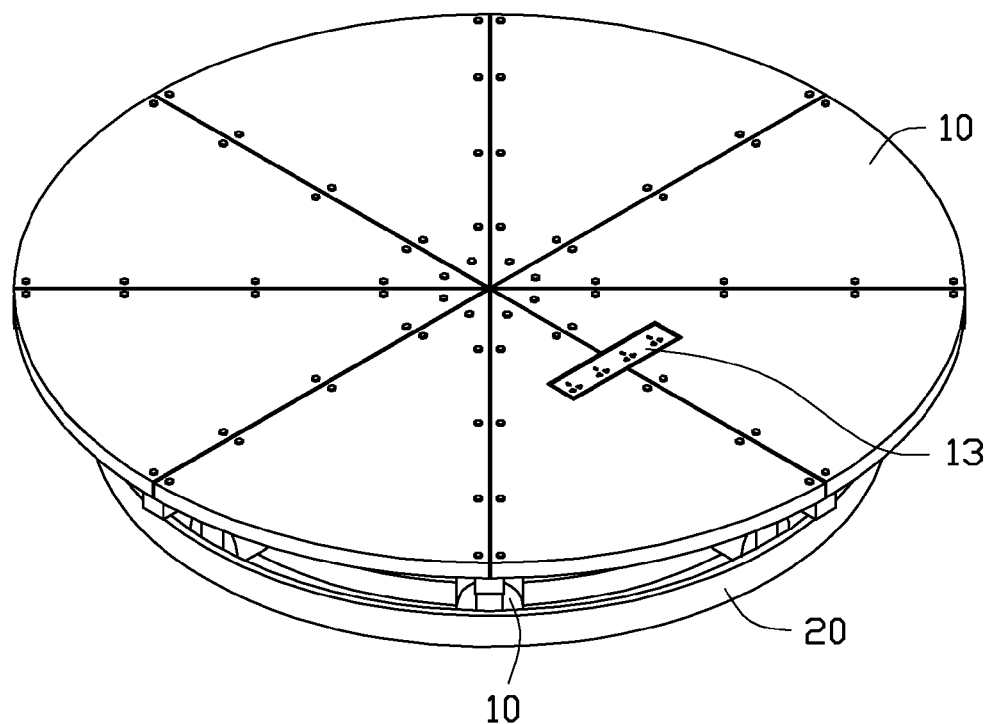
FIG. 1 is an isometric view of an exemplary embodiment of a test platform.
Figure 2:
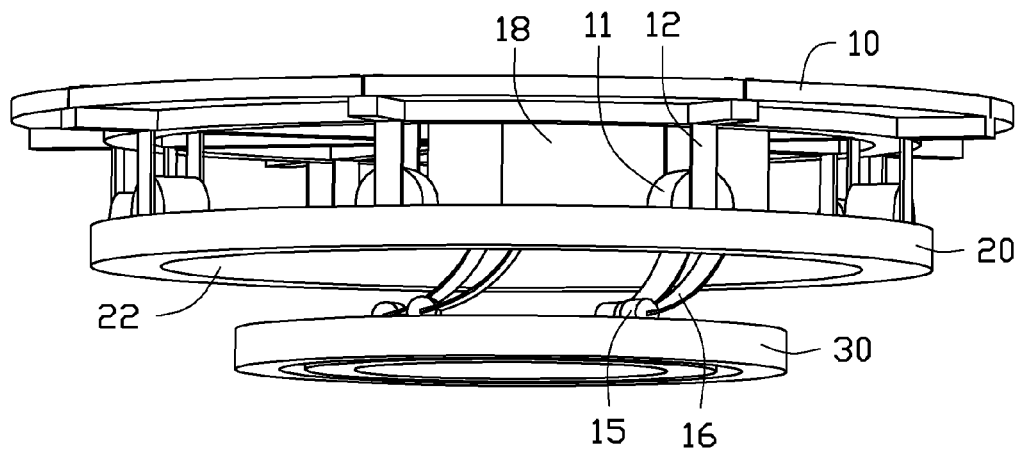
FIG. 2 is another perspective of view of FIG. 1.

FIGS. 1 and 2 show an exemplary embodiment of a test platform to support an electronic equipment undergoing electromagnetic interference (EMI) testing. The test platform includes a round supporting member 10, an annular first slide rail 20 located below the supporting member 10, and an annular second slide rail 30 located below the first slide rail 20. The first slide rail 20 is coaxial with the second slide rail 30, and the outer diameter of the first slide rail 20 is larger than the outer diameter of the second slide rail 30.

A plurality of wheels 11 is rotatably mounted on a bottom of the supporting member 10. Each wheel 11 is connected to the supporting member 10 by two parallel connection poles 12. The wheels 11 rest on the first slide rail 20 and can roll along the first slide rail 20, to rotate the supporting member 10. An uninterrupted power supply (UPS) 18 is mounted on the bottom of the supporting member 10. A power socket 13 is mounted on a top of the supporting member 10 and electrically connected to the UPS 18, to supply power for the electronic equipment. A plurality of wheels 15 is rotatably mounted on each of front and rear sides of a bottom of the UPS 18. Each wheel 15 is connected to the UPS 18 by a connection pole 16 which extends through an opening 22 bounded by the first slide rail 20. The wheels 15 can roll along the second slide rail 30. The connection pole 16, the wheels 15, and the second slide rail 30 are electrically conductive. The second slide rail 30 is supported on a surface (not shown) and connected to a power source (not shown). Supporting material is placed on the surface to support the first slide rail 20.

When the supporting member 10 rotates, the UPS 18 rotates with the supporting member 10 and the wheels 15 rotate along the second slide rail 30. The UPS 18 obtains power from the power source through the connection pole 16, the wheels 15 and the second slide rail 30, and then supplies power to the power socket 13. The power socket 13 is connected to the power source without the use of cables so that the circumstance of cables being tangled will not emerge.

It is believed that the present embodiments and their advantages will be understood from the foregoing description, and various changes may be made thereto without departing from the spirit and scope of the description or sacrificing all of their material advantages, the examples hereinbefore described merely being exemplary embodiments.

What is claimed is:

1. A test platform, comprising:
a supporting member, wherein an uninterrupted power supply (UPS) is mounted on a bottom of the supporting member, a power socket is mounted on the supporting member and electrically connected to the UPS;
a first slide rail located below the supporting member; and
a conductive second slide rail located below the first slide rail for being electrically connected to a power source;
wherein a plurality of first wheels is rotatably mounted on the bottom of the supporting member, each first wheel rests on and rolls along the first slide rail, a plurality of conductive second wheels is rotatably mounted on a bottom of the UPS, and each second wheel rests on and rolls along the second slide rail.

2. The test platform of claim 1, wherein each first wheel is connected to the supporting member by two parallel connection poles.

3. The test platform of claim 1, wherein each second wheel is connected to the UPS by a conductive connection pole.

4. The test platform of claim 1, wherein the first slide rail is annular.

5. The test platform of claim 4, wherein each second wheel is rotatably connected to the UPS by a conductive connection pole.

6. The test platform of claim 5, wherein the conductive connection pole extends through an opening bounded by the first slide rail.

7. The test platform of claim 1, wherein the second slide rail is annular.

* * * * *